United States Patent [19]
Lorenz et al.

[11] Patent Number: 5,768,088
[45] Date of Patent: *Jun. 16, 1998

[54] CONTINUOUSLY VARIABLE CAPACITIVE SWITCH

[75] Inventors: Edwin D. Lorenz, Grand Blanc, Mich.; Michael G. Taranowski, Greendale, Wis.

[73] Assignee: Eaton Corporation, Cleveland, Ohio

[*] Notice: The term of this patent shall not extend beyond the expiration date of Pat. No. 5,559,665.

[21] Appl. No.: 610,040

[22] Filed: Mar. 4, 1996

[51] Int. Cl.⁶ .................................................. H01G 5/00
[52] U.S. Cl. ............................ 361/287; 361/288; 361/320; 361/321.3; 361/292; 361/323
[58] Field of Search ............................... 361/280, 288, 361/322, 287, 320, 321.3, 323, 292

[56] References Cited

U.S. PATENT DOCUMENTS 5,559,665  9/1996  Taranowski et al. ............... 361/280

*Primary Examiner*—Kristine P. Kincaid
*Assistant Examiner*—Anthony Dinkins
*Attorney, Agent, or Firm*—Roger A. Johnston

[57] ABSTRACT

A multiple position or continuously variable capacitive switch which operates by producing a series of discernable changes in the capacitance between a pair of conductors (14,16) disposed in a spaced coplanar relationship on a surface of a non-conductive substrate (12). A dielectric layer (18) is applied over the conductors (14,16) and exposed areas of the substrate (12) surface. A resilient conductive pad (20) is positioned atop the dielectric layer (18) and a user movable actuator (28) is moved to controllably increase the capacitance between the conductors (14,16) by creating progressively greater areas of compression between conductive pad (20) and dielectric layer (18).

18 Claims, 4 Drawing Sheets

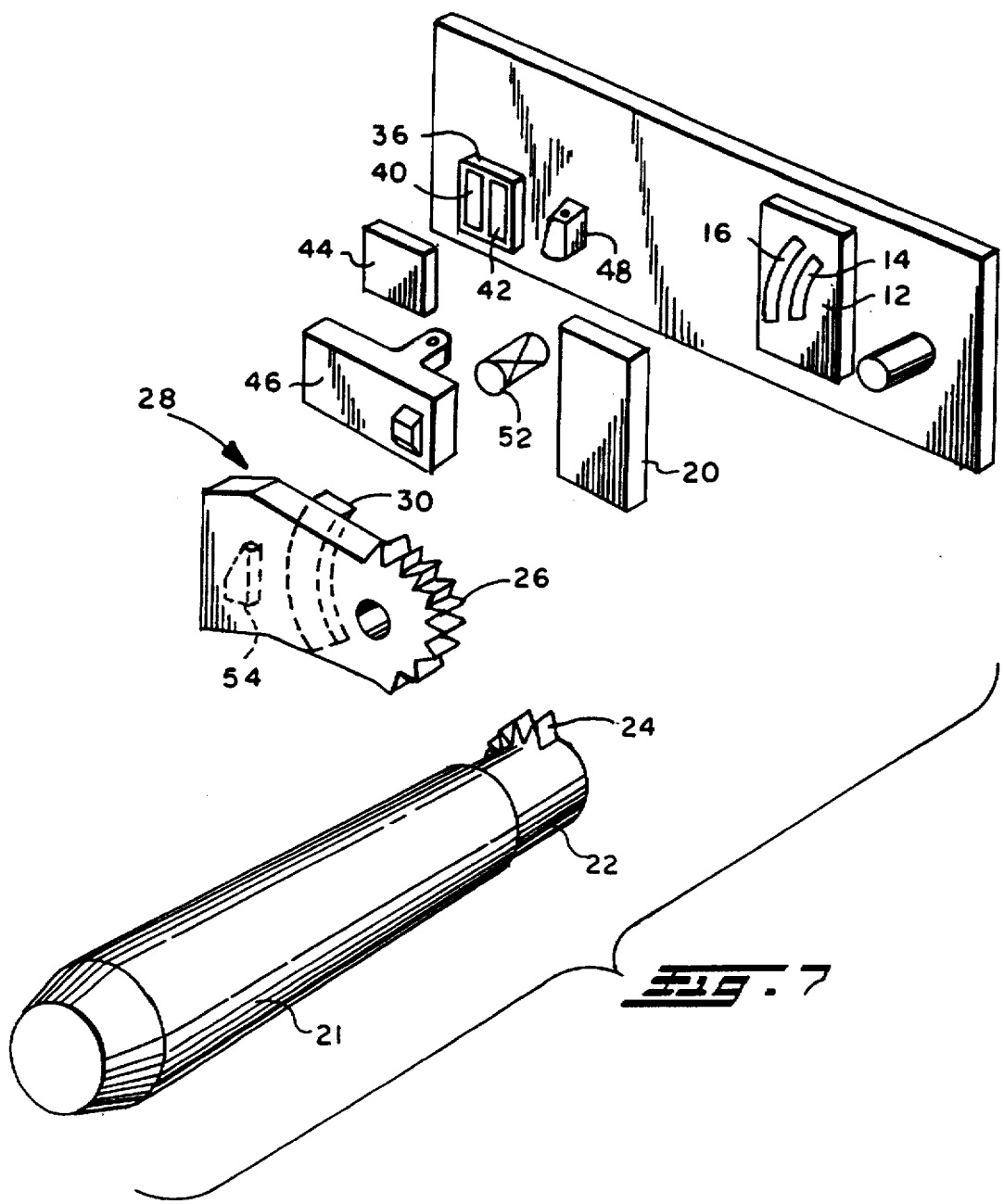

CONTINUOUSLY VARIABLE CAPACITIVE SWITCH

BACKGROUND AND SUMMARY OF THE INVENTION

The present invention relates generally to electrical switches and, more particularly, to a continuously variable multiple position capacitive switch.

Capacitive switches generally effect switching by producing a discernable change in the magnitude of capacitance between a pair of spaced electrodes. This type of switch is often used in low level current switching applications such as for sensing key strokes in computer key pads. An absence of pressure on the key produces a level of low or negligible capacitance and a key stroke results in a substantial capacitance increase. One such capacitive switching device is that disclosed in U.S. patent application Ser. No. 08/386,586 now U.S. Pat. No. 5,559,665, filed Feb. 10, 1995 and entitled "Capacitive Switching Assembly" and assigned assignee's docket number 94-mCON-424 (AP), assigned to the assignee of the present invention and herein incorporated by reference. While the provision of a discernable increase in capacitance is fairly straight-forward, providing this type of switch for an application requiring switching between more than two positions, such as that used to control operation of a typical vehicle intermittent windshield washer/wiper system, requires the creation of multiple detectable levels of capacitance in the switch.

The capacitive switch of the present invention provides a continuously variable or multiple position capacitive switch which is suitable for use in such a vehicle wiper system as well as in a wide variety of additional applications. The switch employs a pair of thin conductive electrodes disposed on the surface of a non-conductive substrate, with a coating of dielectric material applied over the exposed faces of the electrodes. A user movable actuator effects compression of a portion of a resilient conductive pad against the dielectric layer to produce a change in the capacitance produced between the electrodes. Continued movement of the actuator creates an increasing area of compression between the dielectric and pad and thereby brings about continuous detectable increases in the capacitance produced between the electrodes.

Thus, the present switch provides a continuously variable or multiple position capacitive switch which produces a capacitance which is controllably varied through movement of an actuator. The switch produces multiple levels of capacitance in response to a user selected output, such as a particular desired delay wiper speed. These and other features and advantages of the present invention will become readily apparent to one of skill in the art upon review of the following discussion, taken in conjunction with the accompanying drawings.

BRIEF DESCRIPTION OF THE DRAWINGS

FIG. 7 is an exploded assembly view of the capacitive switch as illustrated in detail in the previous figures.

DETAILED DESCRIPTION OF THE PREFERRED EMBODIMENT

Figure 1:
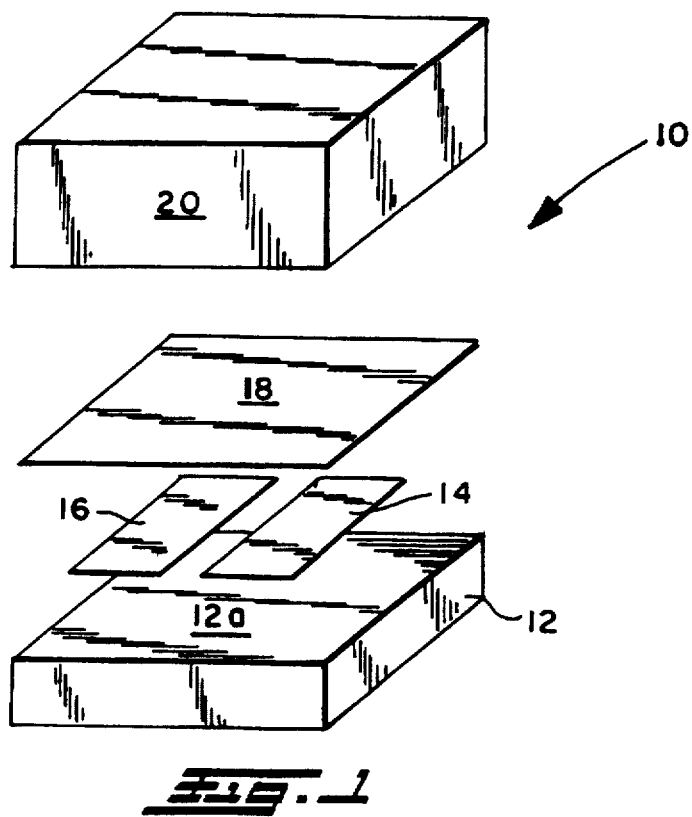
FIG. 1 is an exploded view of a cross section of the capacitive switch of the present invention taken generally about Section A—A of FIG. 2.

Turning now to the drawings, and in particular to FIG. 1, a cross-sectional exploded view of the capacitive switching components of the present switch is indicated generally at 10. Switch assembly 10 includes a non-conductive substrate or base 12, having a pair of spaced coplanar conductors 14,16 disposed thereon. Each conductor 14,16 has an electrical lead (not shown) attached thereto in any suitable fashion, such as by soldering. These leads are preferably electrically coupled to an electronic controller which applies a signal to these leads and thereby detects the varying levels of capacitance produced therebetween.

In the presently preferred embodiment of the invention, substrate 12 is formed of a refractory aluminum oxide material. Conductors 14,16 are formed thereon, preferably by screening a conductive ink composed of a mixture of palladium and silver. However, conductors 14,16 could alternately be formed of any other suitable conductive material and secured to substrate 12 by an adhesive or bonding method. A surface 12a of substrate 12 and conductors 14,16 is coated with a dielectric layer 18. A satisfactory dielectric has been a mixture of ferroelectric and glass material. The subassembly of substrate 12, conductors 14,16 and dielectric layer 18 is preferably fired at a temperature of 930° C. to effect curing of the conductors and dielectric layer.

A switching member 20 is disposed in a position to allow controllable compression of switching member 20 against dielectric layer 18. Switching member 20 is preferably formed of a resiliently deformable material such as silicon rubber interspersed with carbon so as to provide the desired conductivity.

Figure 2:
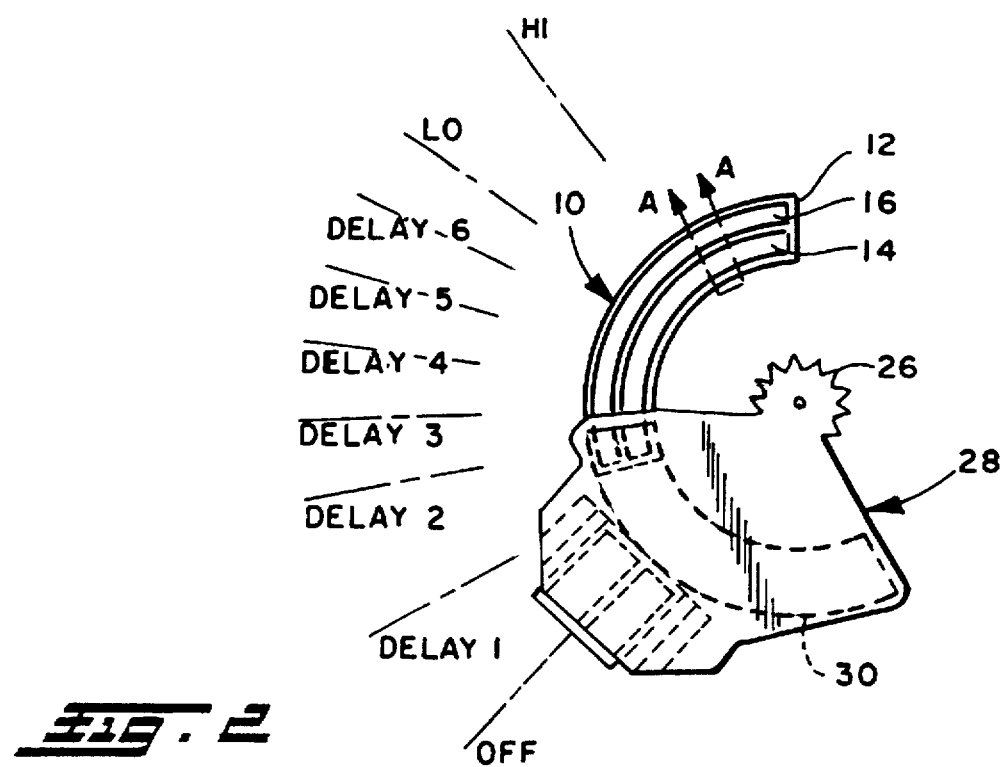
FIG. 2 is a schematic top view of the present switch implemented in a vehicle washer/wiper stem and shown in an OFF position.
Figure 4:
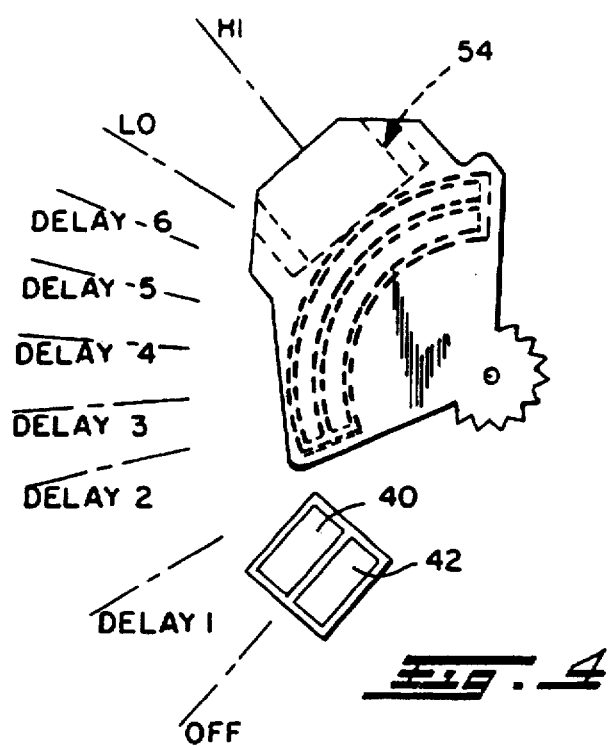
FIG. 4 is a view similar to FIGS. 2 and 3 illustrating the switch in a HIGH position.
Figure 3:
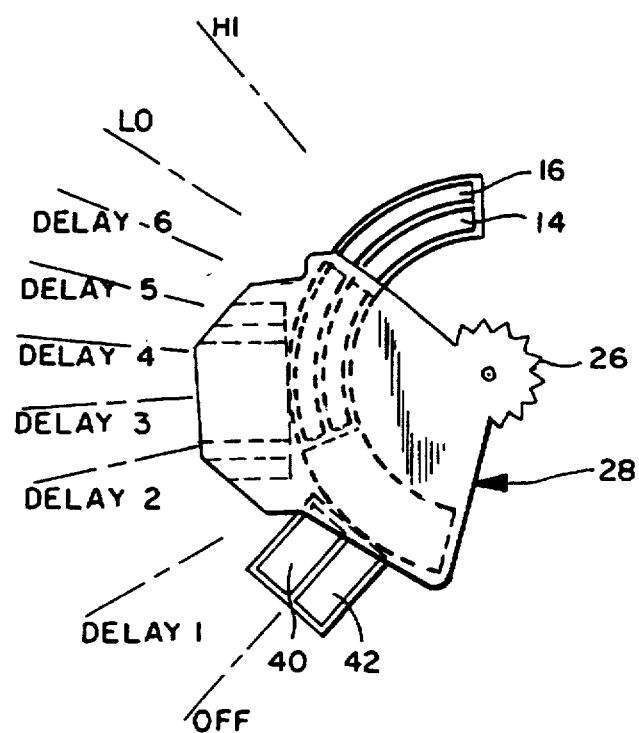
FIG. 3 is a view of the switch similar to FIG. 2 but showing the switch in one of several play positions.

Turning now to FIGS. 2-4, a top view of the present capacitive switch is shown in varying switch positions. While this invention will be described herein as implemented in a vehicle windshield washer/wiper application, it will become readily apparent that it is equally well suited for use in conjunction with a wide variety of additional applications as well.

Switch assembly 10 as used in a vehicle wiper system is configured so as to provide a capacitance between conductors 14 and 16 which varies with a user selected rotational position of a turn signal stalk 21 which is rotatably and movably connected to a vehicle steering wheel column (not shown). This switching action is preferably effected by rotational movement of turn signal stalk 21 which causes concurrent rotation in a rotating actuating mechanism 22 affixed thereto and having a series of gear teeth 24 formed on an outer surface thereof. Teeth 24 on actuating mechanism 22 engage a corresponding set of teeth 26 formed on surface of an actuator 28. Actuator 28 has formed in a lower surface thereof a raised actuating member 30 adapted to be biased against and moved rotationally along an upper surface of switch member 20 to progressively compress an increasing cross-sectional area of switch member 20 against dielectric layer 18 to effect a discernable change in capacitance.

As shown by comparing FIGS. 2 and 3, the actuating member 30 is moved into positions of increasing contact with switching member 20. Actuating member 30 is preferably mounted on actuator 28, or integrally formed therewith, so as to be biased against switching member 20 in a manner which provides an optimal amount of compression of switching member 20 onto dielectric layer 18. In this embodiment, a compression depth of approximately 0.25 millimeter is required to produce a significant change in capacitance and an additional 0.15 millimeter compression provides an order of magnitude increase in capacitance which may be readily detected to provide a switching function. With progressive rotation of actuating member 22, and thereby actuator 28 and actuating member 30, a greater cross-sectional area of switching member 20 is compressed against dielectric layer 18. In the present exemplary embodiment, a 3.0 square millimeter increase in compressed area is produced for each successive delay position.

As the cross-sectional area compressed increases, so does the capacitance produced between conductors 14 and 16. Each 3.0 square millimeter area of compression provides a corresponding increase in capacitance, the amount of this increase generally being dependent upon factors such as the permeability and thickness of the material used. In the presently preferred vehicle intermittent windshield washer/wiper embodiment, nine discernable capacitance levels are produced, these corresponding to an OFF position, six intermediate delay positions, a LOW position and a HIGH position. A mechanical detent system can be employed in conjunction with actuating mechanism 22 so as to create discrete and repeatable positions of actuating member 30 with respect to switch assembly 10. The resultant predictable capacitance values produced in those positions will, in turn, be utilized by a controller (not shown) to create discrete and repeatable windshield wiper speeds, "speed" as used in this case referring to the time period expiring between successive swipes of the wiper across the windshield. The controller preferably reads the capacitance value produced by passing a signal through electrical leads connected to conductors 14 and 16 respectively and controls wiper motor speed based on the sensed capacitance value. By eliminating detented delay positions, instead providing detents only for the OFF, LOW and HIGH positions, a continuously variable capacitance can be effected thereby creating continuously variable wiper delay speeds.

Figure 5:
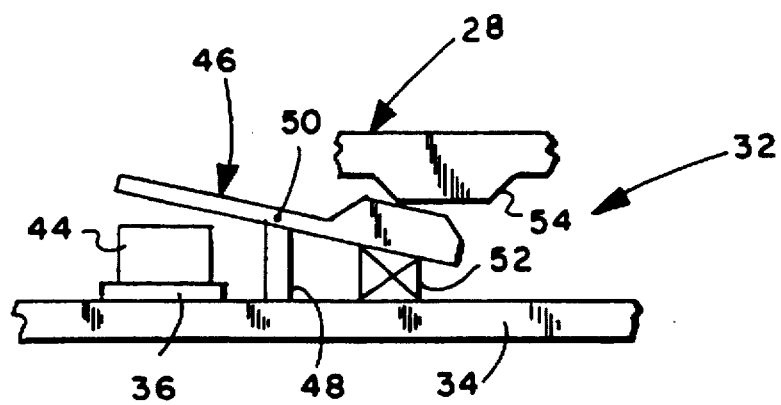
FIG. 5 is a schematic side view of the switch illustrating an optional second actuating member, with the switch in an OFF position.
Figure 6:
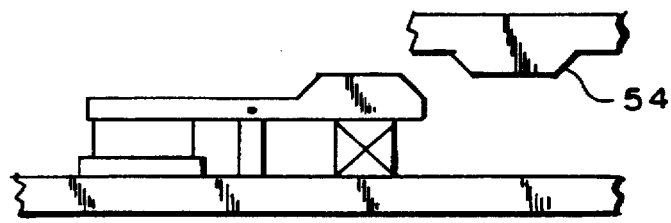
FIG. 6 is a view similar to FIG. 5 illustrating the optional second actuating member when the switch is in any position other than OFF.

In order to further improve the functionality of this system, it is desirable to move from an OFF position with virtually no capacitance produced between electrodes, to a first delay speed with a fairly large jump in capacitance, with subsequent positions effecting somewhat smaller proportional increases in capacitance. This can be accomplished with an optional second actuator 32 as shown in FIGS. 2-4 and in more detail in the side views of FIGS. 5 and 6. As shown in the side view of FIG. 5, a housing 34, preferably also housing switch assembly 10, has disposed thereon a ceramic substrate 36 similar to substrate 12. Ceramic substrate 36 has formed thereon a pair of conductors 40,42 (see FIGS. 2-4) and has formed thereover a dielectric layer (not shown) like that discussed above in conjunction with switch assembly 10. A resilient switch means 44 is further disposed above the dielectric layer.

An actuating arm 46 is pivotally mounted to a post 48 or other suitable support member for rotation about a pivot point 50. Actuating arm 46 is biased about pivot point 50 into compression with switch means 44 by a spring 52, or any other suitable biasing means. In a position corresponding to OFF, shown in FIG. 5, actuating arm 46 is forced down on spring bias 52 by actuator 54 and out of compression with switch means 44. This thereby creates a situation where there is little or no capacitance between conductors 40 and 42. As the actuator 28 is moved to a position other than OFF, (see FIGS. 3, 4 and 6), actuator 54 is moved out of engagement with actuator arm 46, thereby allowing spring 52 to bias actuator arm 46 against switch member 40 causing a sharp increase in capacitance. Further movement of the actuator 28 into the various delay and HIGH and LOW positions cause relatively small cumulative increases in capacitance between conductors 14 and 16 thereafter. Preferably, the controller adds together the capacitances between conductors 14 and 16 and between conductors 40 and 42 to create a cumulative capacitance used to control wiper speed. This arrangement provides for a switch capacitance which is significantly above stray capacitance levels which may be present in the system.

It should be readily apparent that numerous variations are possible on the shapes of the various switch components and that linear actuation, as opposed to rotational, could instead be utilized. In addition, differences in the compressive forces applied by various actuation devices on the conductive rubber pad can also be utilized to vary the amount of capacitance produced. Thus, the present invention provides a continuously variable or multiple position capacitive switch suitable for a vehicle intermittent wiper system as well as a wide array of other applications.

The foregoing discussion discloses and describes merely an exemplary embodiment of the present invention. One skilled in the art will readily recognize from such discussion, and from the accompanying drawings and claims, that various changes and modifications can be made therein without departing from the spirit and scope of the invention as defined by the following claims.

What is claimed is:

1. A capacitive switch comprising:

a substrate;

a pair of conductors disposed on a surface of said substrate in a spaced coplanar arrangement;

a dielectric layer disposed over said substrate and conductors;

a switching member disposed on said dielectric layer, said switching member being formed of a conductive resiliently deformable material; and an actuator disposed for movement along a surface of said switching member opposite said dielectric layer wherein movement of said actuator causes a changing area of compression of said switching member against said dielectric layer and a corresponding discernable change in capacitance between said conductors.

2. The switch of claim 1 further comprising an electrical lead conductively coupled to each of said conductors.

3. The switch of claim 1 wherein said actuator is mounted for rotational movement with respect to said switching member.

4. The switch of claim 1 further comprising:

a second substrate;

a second pair of conductors disposed on a surface of said second substrate in a spaced coplanar arrangement;

a second dielectric layer disposed over said second substrate and said second conductors;

a second switching member disposed on said second dielectric layer, said second switching member being formed of a conductive resiliently deformable material; and a second actuator disposed to effect compression of said second switching member against said second dielectric layer.

5. The switch of claim 4 wherein said second actuator includes an actuator arm mounted for pivotal movement and a means for biasing said actuator arm into a position effecting said compression of said second switching member.

6. The switch of claim 5 wherein said second actuator moves with said actuator.

7. The switch of claim 4 having at least two switching states, a first state corresponding to an OFF position of said switch, wherein said second actuator effects compression of said second switching member in all positions other than said OFF position.

8. The switch of claim 7 wherein said compression of said second switching member effects a change in capacitance between said second pair of conductors and movement of said actuator causes an additional capacitance between said first pair of conductors.

9. A method of making a capacitive switch comprising:

providing a substrate;

forming a pair of conductors on a surface of said substrate;

forming a layer of dielectric material over said substrate surface and said conductors;

providing a resiliently deformable conductive material over said dielectric layer; and providing an actuator adapted to compress said resiliently deformable material against said dielectric layer to change a capacitance produced between said pair of conductors, said actuator being positionable between an OFF position wherein said resiliently deformable conductive material is not compressed, a HIGH position wherein a maximum amount of said resiliently deformable conductive material is compressed against said layer of dielectric material and at least one intermediate position wherein said resiliently deformable conductive material is only partially compressed.

10. The method of claim 9 wherein said actuator is mounted for rotational movement between said positions.

11. The method of claim 9 wherein said conductors are formed of a conductive ink and are screened onto said substrate.

12. The method of claim 11 wherein said conductive ink is comprised of palladium and silver.

13. The method of claim 9 wherein said conductors are bonded to said substrate.

14. The method of claim 9 wherein said resiliently deformable material is a silicon rubber interspersed with carbon.

15. The method of claim 9 further comprising the steps of:

providing a second substrate;

forming a second pair of conductors on a surface of said second substrate;

forming a second layer of dielectric material over said second substrate and said second conductors;

providing a second resiliently deformable material on said second dielectric layer; and providing a second actuator adapted to compress said second resiliently deformable material against said second layer of dielectric material to change a capacitance produced between said second pair of conductors.

16. The method of claim 15 further comprising the step of adding the capacitances produced by said first and second pairs of conductors to produce a combined switch capacitance.

17. The method of claim 15 wherein a significant capacitance is produced between said second pair of conductors only when said actuator is in a position other than said OFF position.

18. A capacitive switch for controlling the movement of a wiper arm in a vehicle intermittent windshield washer/wiper system comprising:

a substrate;

a pair of conductors disposed in a coplanar spaced relationship on a surface of said substrate;

a dielectric layer disposed over said substrate surface and conductors;

a switching member disposed on said dielectric layer, said switching member formed of a conductive resiliently deformable material; and an actuator being adapted for rotational movement by a user between a position corresponding to an OFF condition of said washer/wiper system, a series of intermediate positions used to select a variable speed of said washer/wiper system and a HIGH position corresponding to the selection of the fastest speed of said washer/wiper system, thereby effecting increasing areas of compression of said resiliently deformable material against said dielectric layer.

\* \* \* \* \*